United States Patent
Mao

(10) Patent No.: US 9,435,139 B2
(45) Date of Patent: Sep. 6, 2016

(54) LOCK MECHANISM AND BOX-SHAPED APPARATUS THEREOF

(71) Applicant: Wistron Corporation, New Taipei (TW)

(72) Inventor: Zhong-hui Mao, New Taipei (TW)

(73) Assignee: Wistron Corporation, New Taipei (TW)

( * ) Notice: Subject to any disclaimer, the term of this patent is extended or adjusted under 35 U.S.C. 154(b) by 321 days.

(21) Appl. No.: 14/187,326

(22) Filed: Feb. 24, 2014

(65) Prior Publication Data
US 2015/0114051 A1    Apr. 30, 2015

(30) Foreign Application Priority Data
Oct. 28, 2013  (CN) .......................... 2013 1 0518135

(51) Int. Cl.
E05C 3/02      (2006.01)
E05B 15/00    (2006.01)
(Continued)

(52) U.S. Cl.
CPC ......... *E05B 15/0053* (2013.01); *E05B 35/008* (2013.01); *E05B 65/0841* (2013.01); *E05C 3/02* (2013.01); *G06F 1/183* (2013.01); *G11B 33/022* (2013.01); *H05K 5/0208* (2013.01); *H05K 5/0221* (2013.01); *E05B 65/006* (2013.01); *E05B 2015/0458* (2013.01); *E05B 2015/0493* (2013.01); *Y10S 292/11* (2013.01);
(Continued)

(58) Field of Classification Search
CPC .............. E05B 35/008; E05B 65/0841; E05B 15/0053; E05B 2015/0458; E05B 2015/0493; E05B 65/006; E05B 65/52; E05C 3/02; Y10T 70/50; Y10T 70/70; Y10T 292/088; Y10T 292/0876; Y10T 292/0883; Y10T 292/1043; Y10T 292/1075; Y10T 292/108; Y10S 292/11; H05K 5/00; H05K 5/0221
USPC ............ 292/1, 80, 81, 86, 87, 303, 76, 194, 292/195, 219, 220, 227, 228, 70, 78, 200
See application file for complete search history.

(56) References Cited

U.S. PATENT DOCUMENTS 325,017  A  *  8/1885  Schmidt .................. E05B 65/52
                                                    70/66
886,165  A  *  4/1908  Vore .......................... E05C 3/30
                                                    292/127
(Continued)

FOREIGN PATENT DOCUMENTS

DE   102009019517 A1 * 12/2010 ............. E05B 63/14
FR        2992606 A1 *  1/2014 ............. E05B 83/32
(Continued)

*Primary Examiner* — Vishal Patel
*Assistant Examiner* — Christine M Mills
(74) *Attorney, Agent, or Firm* — Winston Hsu; Scott Margo

(57) ABSTRACT

A lock mechanism includes a driving arm having an arm portion and a fixing portion and a lock rod having first and second ends and a pivot portion. The pivot portion is pivoted to one of a cover and a casing. The fixing portion is disposed on the one of the cover and the casing so as to make a free end of the arm portion interfere with an interference portion of the lock rod. The arm portion swings to a first position or a second position when receiving force. When the first end or the second end is pressed, the interference portion drives the free end to make the arm portion swing to the first or second position, so as to make the lock rod move to a locking position for fixing the cover on the casing or a releasing position for releasing the cover from the casing.

26 Claims, 14 Drawing Sheets

(51) Int. Cl.

| | | |
|---|---|---|
| *E05B 35/00* | (2006.01) | |
| *E05B 65/08* | (2006.01) | |
| *H05K 5/02* | (2006.01) | |
| *G11B 33/02* | (2006.01) | |
| *G06F 1/18* | (2006.01) | |
| *E05B 65/00* | (2006.01) | |
| *E05B 15/04* | (2006.01) | |

(52) U.S. Cl.
CPC ................ *Y10T 70/50* (2015.04); *Y10T 70/70* (2015.04); *Y10T 292/088* (2015.04); *Y10T 292/0876* (2015.04); *Y10T 292/0883* (2015.04); *Y10T 292/108* (2015.04); *Y10T 292/1043* (2015.04); *Y10T 292/1075* (2015.04)

(56) References Cited

U.S. PATENT DOCUMENTS

| | | | | |
|---|---|---|---|---|
| 2,161,542 A | * | 6/1939 | Titus | E05C 17/50 292/128 |
| 2,480,988 A | * | 9/1949 | Walton | E05D 13/06 292/218 |
| 2,871,690 A | * | 2/1959 | Johnson | E05C 3/162 292/127 |
| 3,736,051 A | * | 5/1973 | Conner | G03B 21/10 242/338 |
| 4,413,849 A | * | 11/1983 | Davis | E05C 3/048 292/229 |
| 4,627,650 A | * | 12/1986 | Hauschulte | E05C 19/14 292/113 |
| 5,310,049 A | * | 5/1994 | Bigelow | G03B 27/588 206/1.5 |
| 6,561,554 B2 | * | 5/2003 | Colbert | E05C 3/14 292/128 |
| 8,899,702 B2 | * | 12/2014 | Mao | H05K 5/0239 312/222 |
| 8,944,538 B2 | * | 2/2015 | Li | H05K 7/20172 312/223.2 |
| 2011/0279972 A1 | * | 11/2011 | Xue | E05B 17/04 361/679.57 |
| 2015/0245515 A1 | * | 8/2015 | Baek | G06F 1/1613 361/679.4 |

FOREIGN PATENT DOCUMENTS

| | | | | |
|---|---|---|---|---|
| FR | EP 2785159 A1 | * | 10/2014 | ........... H05K 5/0221 |
| FR | 3016652 A1 | * | 7/2015 | ......... E02D 29/1427 |

* cited by examiner

LOCK MECHANISM AND BOX-SHAPED APPARATUS THEREOF

BACKGROUND OF THE INVENTION

1. Field of the Invention

The present invention relates to a lock mechanism and a box-shaped apparatus thereof, and more specifically, to a lock mechanism utilizing linkage of a bi-directional swinging arm and a pivoting lock rod to lock a cover on a casing and a box-shaped apparatus thereof.

2. Description of the Prior Art

In general, a conventional box-shaped apparatus, such as a network storage device or a computer host, has a cover disposed on a side of a casing for providing a containing space to contain internal components, such as a printed circuit board, a hard disk drive or a heat sink. For effectively preventing the box-shaped apparatus from being opened arbitrarily so as to cause unpredictable danger, such as a child's finger being scalded or cut by the internal components, or cause damage of the internal components, a lock (e.g. a combination lock) is usually disposed on the outside of the cover of the box-shaped apparatus for locking the cover on the casing.

However, the aforesaid design may cause complicated locking and releasing processes so that it is inconvenient for a user to lock the cover on the casing or detach the cover from the casing. Furthermore, disposing the lock on the outside of the cover not only affects the appearance of the box-shaped apparatus, but also causes the problem that the lock could be operated arbitrarily so that the box-shaped apparatus may be opened accidentally.

SUMMARY OF THE INVENTION

A purpose of the present invention is to provide a lock mechanism utilizing linkage of a bi-directional swinging arm and a pivoting lock rod to lock a cover on a casing, and a box-shaped apparatus thereof to solve the aforesaid problems.

According to an embodiment, a lock mechanism is for detachably fixing a cover on a side of a casing. The lock mechanism includes a lock rod and a driving arm. The lock rod has a first end, a second end and a pivot portion between the first end and the second end. The lock rod is pivoted to one of the cover and the casing through the pivot portion so that the first end and the second end could perform a lever movement relative to the pivot portion. The first end has an interference portion. The driving arm is connected to a side of the lock rod and has a fixing portion and an arm portion connected to the fixing portion. The driving arm is disposed on the one of the cover and the casing through the fixing portion so as to make a free end of the arm portion interfere with the interference portion of the lock rod. The arm portion swings to a first swing position when receiving force in a first direction or swings to a second swing position when receiving force in a second direction opposite to the first direction. The interference portion drives the free end of the arm portion to make the arm portion swing to the first swing position or the second swing position when the first end or the second end is pressed, so as to make the lock rod move to a locking position for fixing the cover on the casing or move to a releasing position for releasing the cover from the casing.

According to another embodiment, a box-shaped apparatus includes a casing, a cover and a lock mechanism. The cover is engaged with the casing to form a containing space. The lock mechanism is for detachably fixing the cover on a side of the casing. The lock mechanism includes a lock rod and a driving arm. The lock rod has a first end, a second end and a pivot portion between the first end and the second end. The lock rod is pivoted to one of the cover and the casing through the pivot portion so that the first end and the second end could perform a lever movement relative to the pivot portion. The first end has an interference portion. The driving arm is connected to a side of the lock rod and has a fixing portion and an arm portion connected to the fixing portion. The driving arm is disposed on the one of the cover and the casing through the fixing portion so as to make a free end of the arm portion interfere with the interference portion of the lock rod. The arm portion swings to a first swing position when receiving force in a first direction or swings to a second swing position when receiving force in a second direction opposite to the first direction. The interference portion drives the free end of the arm portion to make the arm portion swing to the first swing position or the second swing position when the first end or the second end is pressed, so as to make the lock rod move to a locking position for fixing the cover on the casing or move to a releasing position for releasing the cover from the casing.

In summary, the present invention utilizes linkage of the bi-directional swinging arm and the pivoting lock rod to lock the cover on the casing. In such a manner, via the aforesaid simple pressing operations, the user could easily lock or release the box-shaped apparatus so as to enhance the convenience of the box-shaped apparatus in detaching the cover from the casing and locking the cover on the casing. Furthermore, via the hidden design in which the lock mechanism is disposed in the cover and the casing, the present invention not only makes the appearance of the box-shaped apparatus more compact, but also effectively solve the prior art problem that the lock disposed outside the box-shaped apparatus could be operated arbitrarily so that the box-shaped apparatus may be opened accidentally. Accordingly, the use security of the box-shaped apparatus could be greatly enhanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
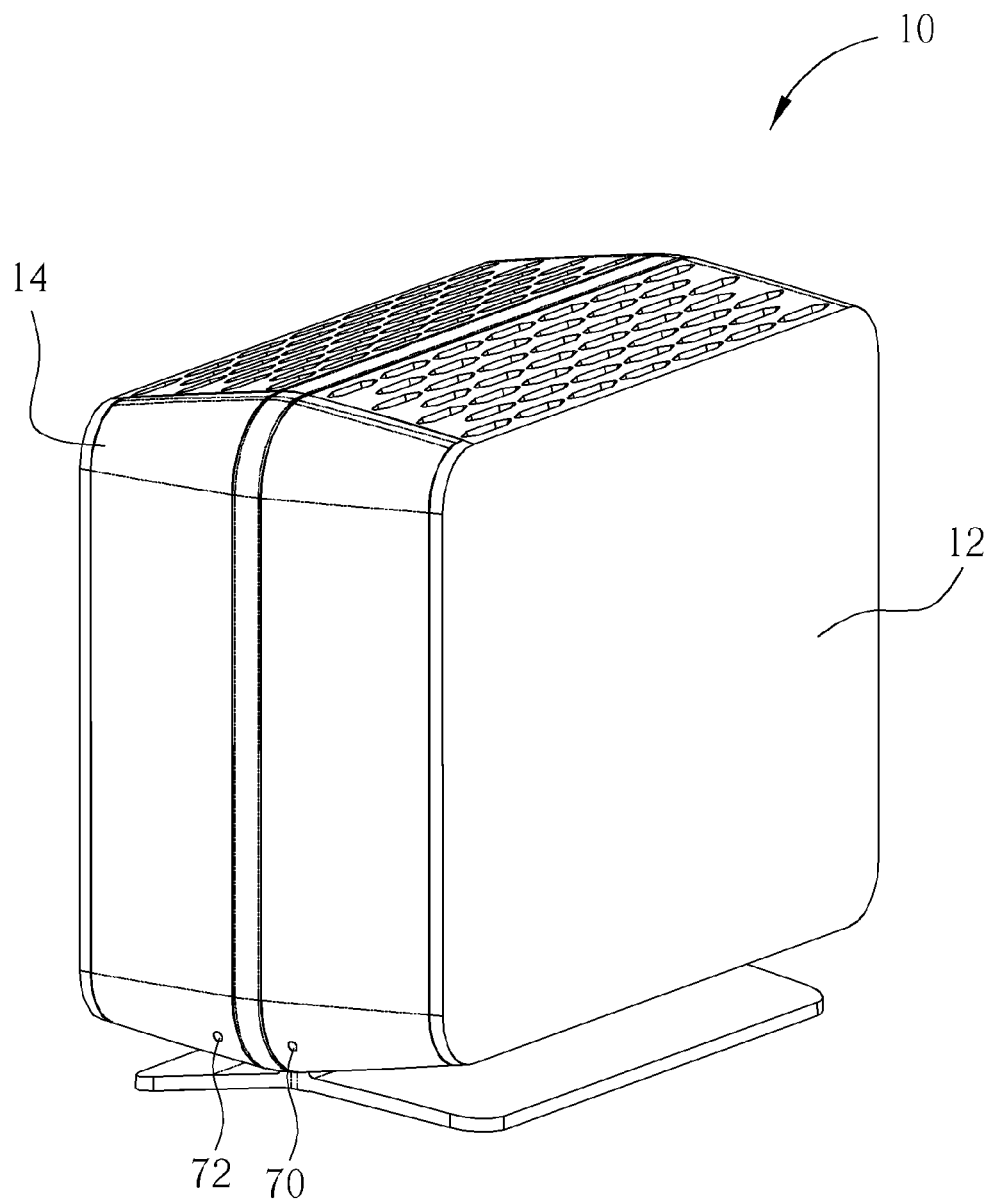
FIG. 1 is a schematic diagram of a box-shaped apparatus according to an embodiment of the present invention.
Figure 2:
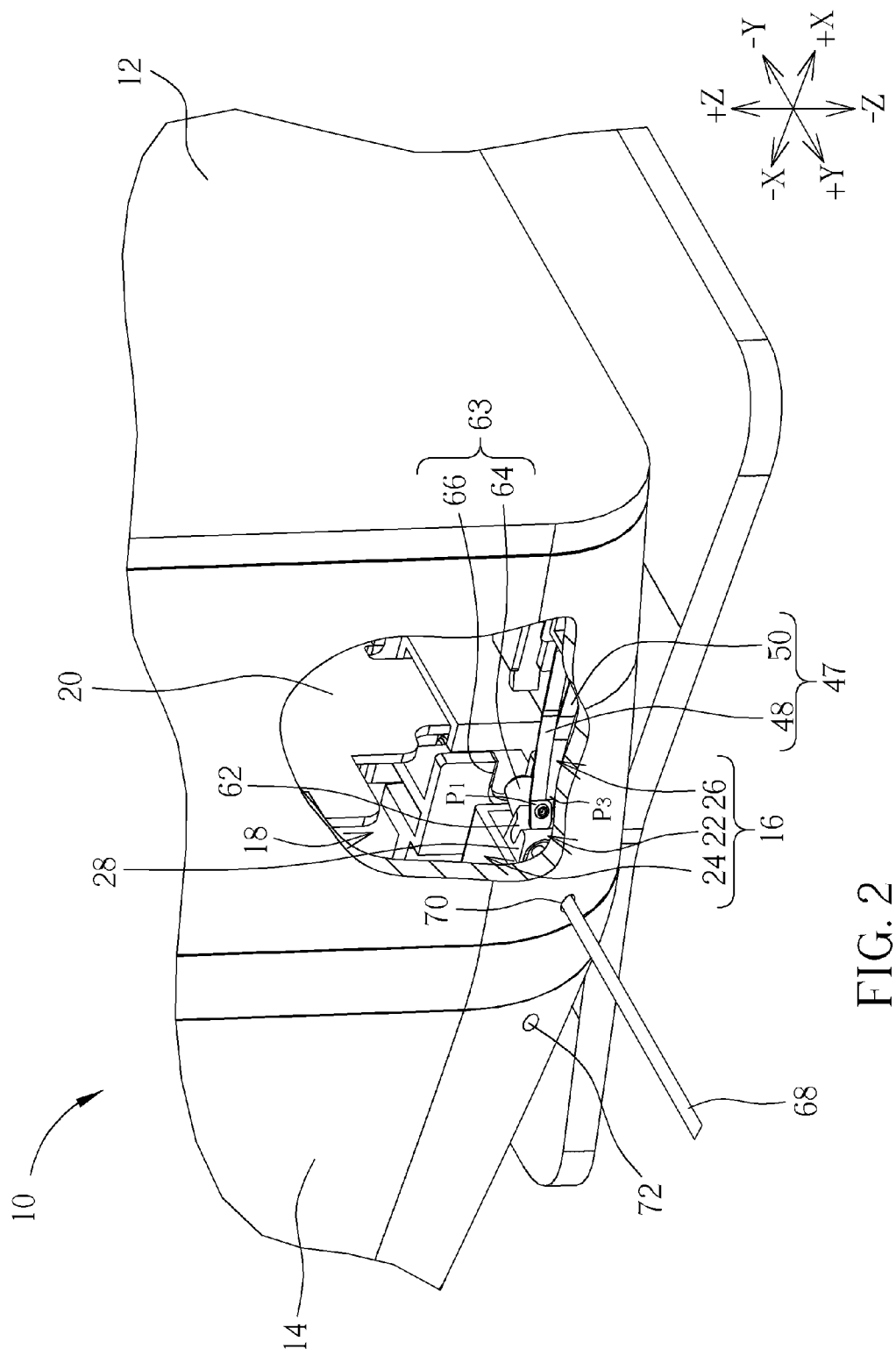
FIG. 2 is a partial internal view of the box-shaped apparatus in FIG. 1.

Please refer to FIG. 1 and FIG. 2. FIG. 1 is a schematic diagram of a box-shaped apparatus 10 according to an embodiment of the present invention. FIG. 2 is a partial internal view of the box-shaped apparatus 10 in FIG. 1. The box-shaped apparatus 10 includes a casing 12, a cover 14 and a lock mechanism 16, as shown in FIG. 1 and FIG. 2. The cover 14 could adopt a conventional cover design, such as a sliding cover design in which the cover 14 could be inserted in a track of the casing 12 so as to be slidable up and down relative to the casing 12, to be disposed on a side of the casing 12 to form a containing space 18 cooperatively with the casing 12 for providing protection and dustproof functions. In this embodiment, the box-shaped apparatus 10 further includes a network storage device 20. The network storage device 20 is disposed in the containing space 18 for forming a network storage apparatus cooperatively with the casing 12 and the cover 14.

Figure 3:
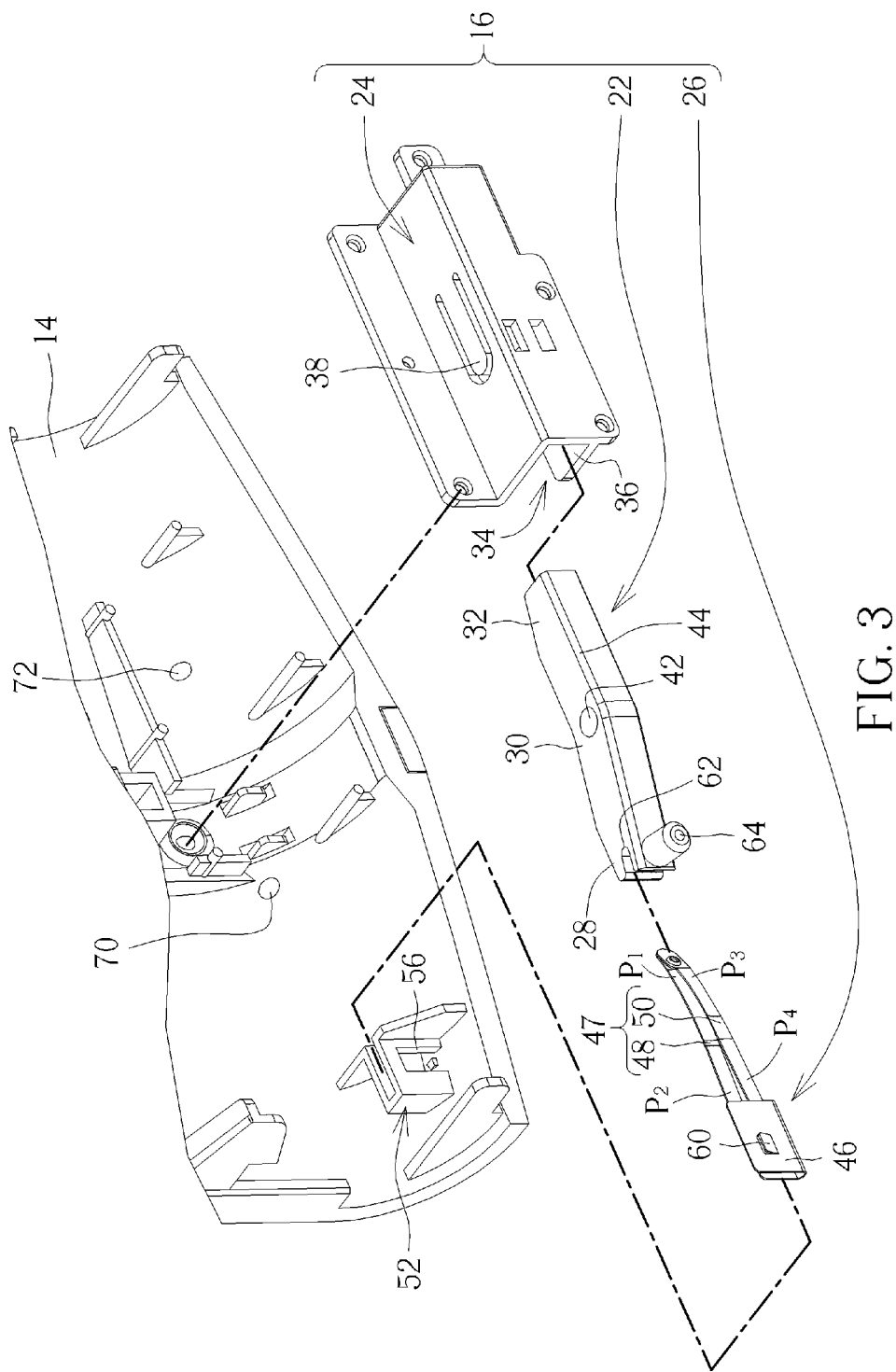
FIG. 3 is an exploded diagram of a cover and a lock mechanism in FIG. 2.
Figure 4:
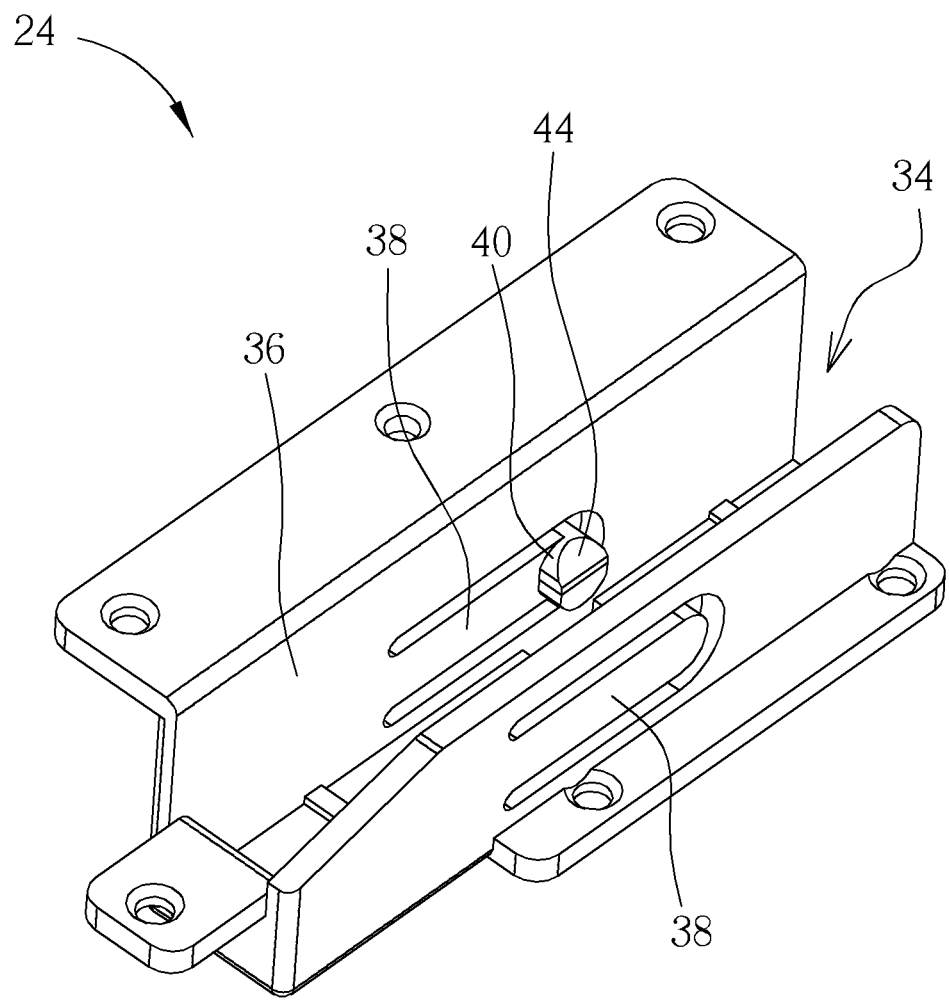
FIG. 4 is a schematic diagram of a constraining frame in FIG. 3 from another viewing angle.
Figure 5:
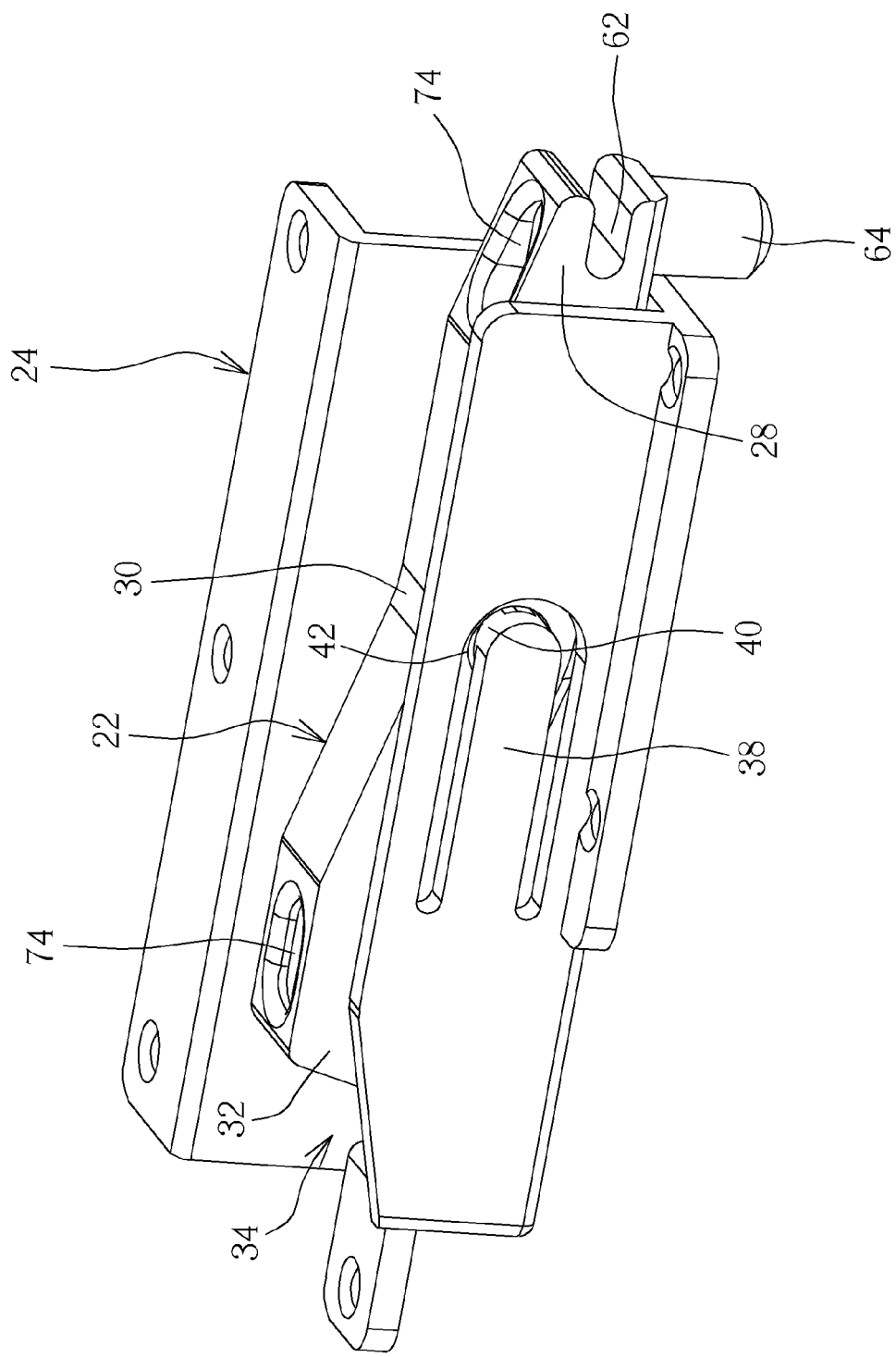
FIG. 5 is an assembly diagram of a lock rod being disposed in the constraining frame in FIG. 3.

Please refer to FIG. 3, which is an exploded diagram of the cover 14 and the lock mechanism 16 in FIG. 2. The lock mechanism 16 is for detachably fixing the cover 14 on a side of the casing 12. As shown in FIG. 3, the lock mechanism 16 includes a lock rod 22, a constraining frame 24 and a driving arm 26. In this embodiment, the lock mechanism 16 is disposed on the cover 14 for locking. To be more specific, please refer to FIG. 3, FIG. 4 and FIG. 5. FIG. 4 is a schematic diagram of a constraining frame 24 in FIG. 3 from another viewing angle. FIG. 5 is an assembly diagram of the lock rod 22 being disposed in the constraining frame 24 in FIG. 3. As shown in FIG. 3, FIG. 4 and FIG. 5, the lock rod 22 has a first end 28, a pivot portion 30 and a second end 32. The pivot portion 30 is located between the first end 28 and the second end 32. The constraining frame 24 is disposed on the cover 14 (e.g. by screws). A concave portion 34 is formed on the constraining frame 24 for containing the lock rod 22 to pivot therein, so that the constraining frame 24 could form a lever mechanism cooperatively with the lock rod 22 to make the first end 28 and the second end 32 capable of performing a lever movement relative to the pivot portion 30. The concave portion 34 is further for constraining the movement range of the lock rod 22 when the first end 28 or the second end 32 is pressed. The lock rod 22 is preferably a V-shaped lever structure for reducing the pivotal movement range of the lock rod 22, but not limited thereto.

The lock rod 22 could adopt a conventional pivoting design to be pivotally disposed in the constraining frame 24. For example, in this embodiment, at least one elastic arm 38 (two as shown in FIG. 4) is formed on an inner wall 36 of the concave portion 34. A pivot shaft 40 is formed on an end of the elastic arm 38. A pivot hole 42 is formed on the pivot portion 30 corresponding to the pivot shaft 40. Accordingly, the elastic arm 38 could be used for providing elastic force to drive the pivot shaft 40 to insert into the pivot hole 42 as the lock rod 22 is contained in the concave portion 34 (as shown in FIG. 5) so as to make the pivot portion 30 pivotally connect to the constraining frame 24. In addition, as shown in FIG. 3 and FIG. 4, a chamfer structure 44 is respectively formed on the pivot shaft 40 and the assembling path of the lock rod 22 corresponding to the pivot shaft 40. The pivot shaft 40 could be inserted into the pivot hole 42 more smoothly through cooperating of the chamfer structure 44 of the lock rod 22 with the chamfer structure 44 of the pivot shaft 40.

Figure 6:
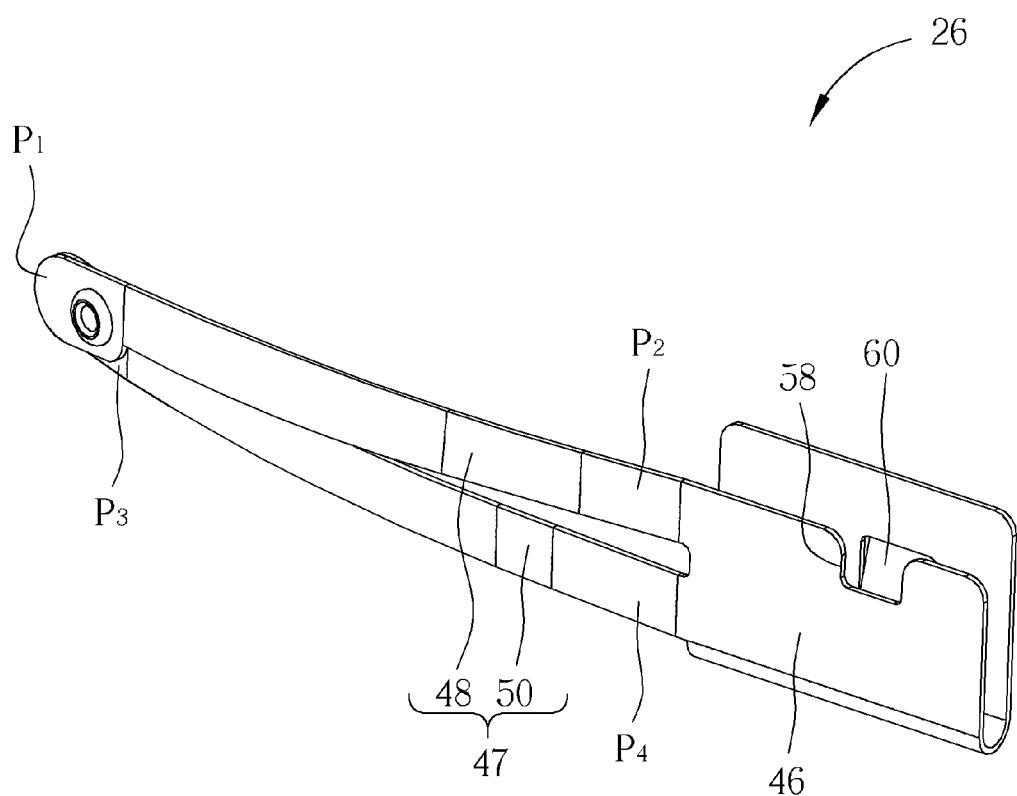
FIG. 6 is an enlarged diagram of a driving arm in FIG. 3.
Figure 7:
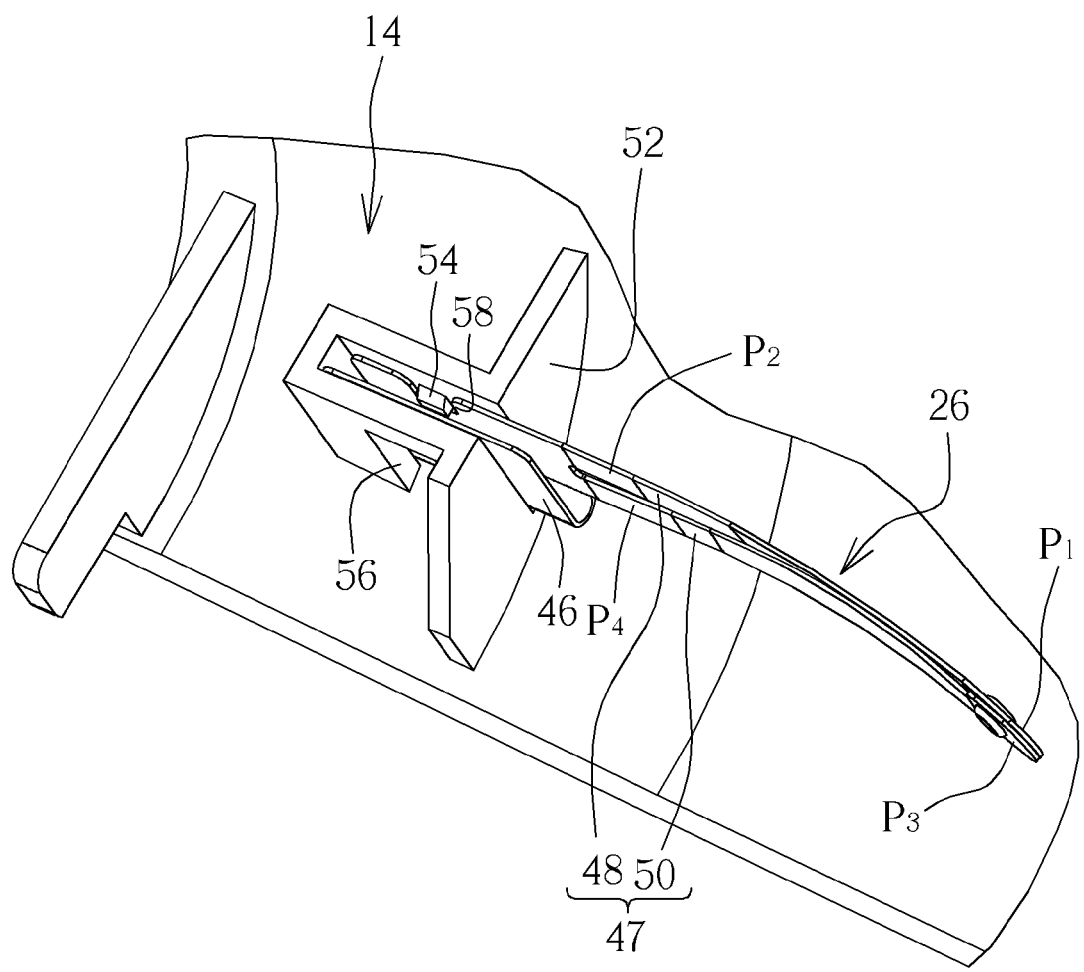
FIG. 7 is an assembly diagram of the driving arm being disposed on the cover in FIG. 3.
Figure 8:
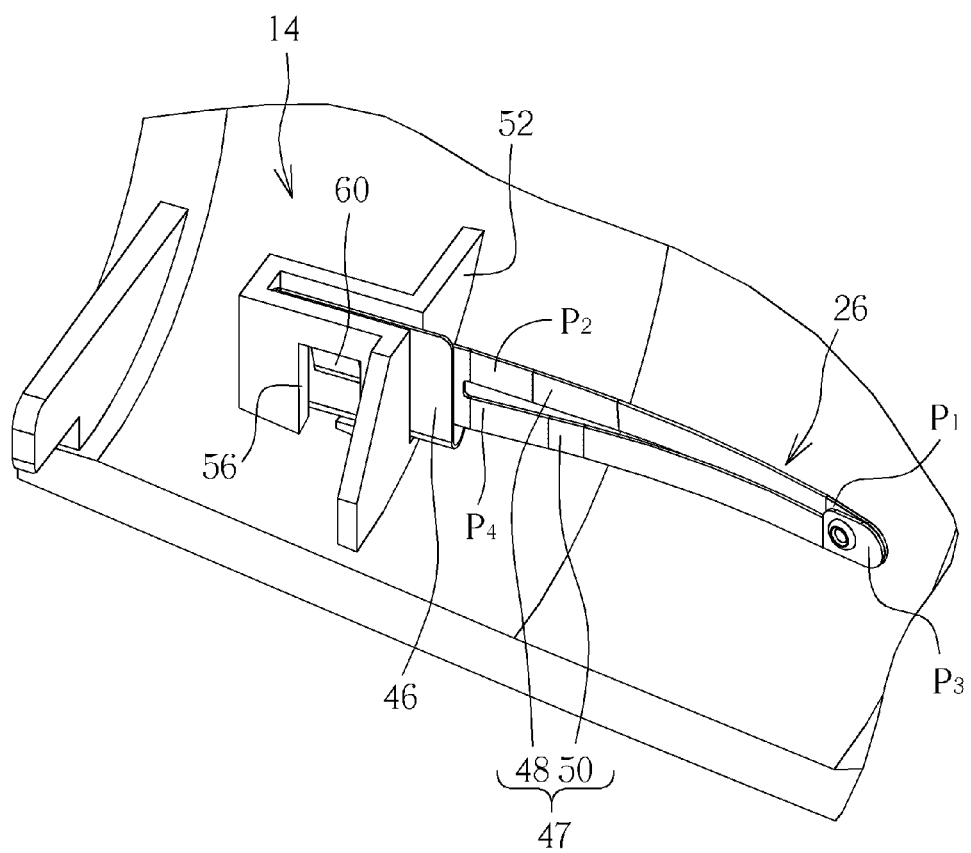
FIG. 8 is an assembly diagram of the driving arm being disposed on the cover from another viewing angle in FIG. 7.

Subsequently, please refer to FIG. 3, FIG. 6, FIG. 7 and FIG. 8. FIG. 6 is an enlarged diagram of the driving arm 26 in FIG. 3. FIG. 7 is an assembly diagram of the driving arm 26 being disposed on the cover 14 in FIG. 3. FIG. 8 is an assembly diagram of the driving arm 26 being disposed on the cover 14 from another viewing angle in FIG. 7. As shown in FIG. 3, FIG. 6, FIG. 7 and FIG. 8, the driving arm 26 is disposed on a side of the lock rod 22 and has a fixing portion 46 and an arm portion 47. In this embodiment, the driving arm 26 could adopt a bi-directional swinging design in which the arm portion 47 includes a first arm structure 48 and a second arm structure 50, but not limited thereto. In another embodiment, the driving arm 26 could be other component capable of swinging bi-directionally, such as a common bi-stable strap. The fixing portion 46 and the cover 14 could be fixed by structural engagement, but not limited thereto, meaning that the fixing portion 46 and the cover 14 could also adopt other common fixing design, such as a screw locking design. For example, in this embodiment, the cover 14 has a fixing base 52. The fixing base 52 has a fixing protrusion 54 and a fixing hole 56. An engaging slot 58 and an elastic sheet 60 are formed on the fixing portion 46. Accordingly, the elastic sheet 60 could pop up from the fixing hole 56 to engage with the fixing hole 56 (shown in FIG. 8) as the engaging slot 58 is engaged with the fixing protrusion 54 (shown in FIG. 7), so as to make the driving arm 26 fix on the cover 14.

Figure 9:
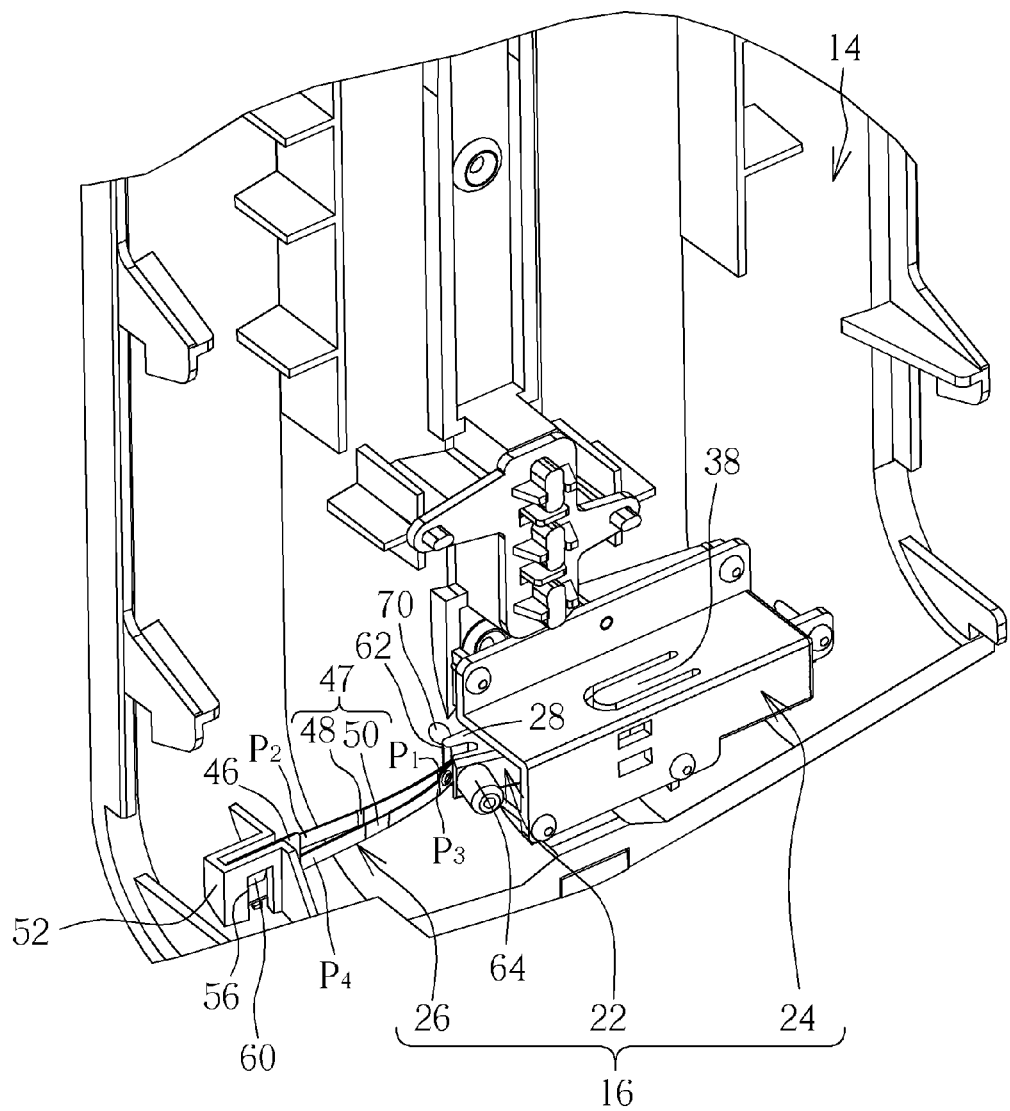
FIG. 9 is an assembly diagram of the lock mechanism in FIG. 3 being disposed on the cover.

In addition, the first end 28 of the lock rod 22, the first arm structure 48 and the second arm structure 50 are illustrated in FIG. 3, FIG. 6 and FIG. 9. FIG. 9 is an assembly diagram of the lock mechanism 16 in FIG. 3 being disposed on the cover 14. As shown in FIG. 3, FIG. 6 and FIG. 9, the first end 28 has an interference portion 62 (preferably a recess, but not limited thereto). The first arm structure 48 has a first free end $P_1$ and a first fixing end $P_2$, and the second arm structure 50 has a second free end $P_3$ and a second fixing end $P_4$. The first free end $P_1$ is connected to the second free end $P_3$ for forming a free end of the arm portion 47 away from the fixing portion 46 cooperatively to cause bending deformation of the first arm structure 48 and the second arm structure 50, so that the free end could swing bi-directionally and extend into the recess 62 to cause interference with the recess 62. The first fixing end $P_2$ and the second fixing end $P_4$ are adjacent to each other and connected to the fixing portion 46. In such a manner, via the aforesaid design, the interference portion 62 could drive the first free end $P_1$ and the second free end $P_3$ to swing to a corresponding swing position when the first end 28 or the second end 32 is pressed. Accordingly, the lock rod 22 could move to a locking position for fixing the cover 14 on the casing 12, or could move to a releasing position for releasing the cover 14 from the casing 12 so that the cover 14 could be detached from the casing 12.

The lock rod 22 could adopt a conventional locking design to engage with the casing 12, such as a shaft-hole matching design, a concave-convex fit design, a hooking engagement design. For example, as shown in FIG. 2, a lock device 63 is disposed on the first end 28. The lock device 63 includes a positioning pillar 64 disposed on the first end 28 and a positioning slot 66 disposed on the casing 12. The positioning pillar 64 is for inserting into the positioning slot 66 so as to fix the cover 14 on the side of the casing 12 as the lock rod 22 moves to the locking position. Furthermore, for operating the lock rod 22 conveniently, as shown in FIG. 1, FIG. 2 and FIG. 5, the box-shaped apparatus 10 further includes an actuating rod 68. A first through hole 70 is formed on the cover 14 corresponding to the first end 28, and a second through hole 72 is formed on the cover 14 corresponding to the second end 32. Accordingly, the actuating rod 68 could be used for passing through the first through hole 70 to press the first end 28 or passing through the second through hole 72 to press the second end 32. To be noted, in this embodiment, a pressing recess 74 is formed on the first end 28 and the second end 32 of the lock rod 22 respectively. The pressing recess 74 is used for assisting the actuating rod 68 to press the first end 28 and the second end 32 accurately, and for preventing the actuating rod 68 from slipping out of the first end 28 or the second end 32 during the actuating rod 68 presses the first end 28 or the second end 32.

Figure 10:
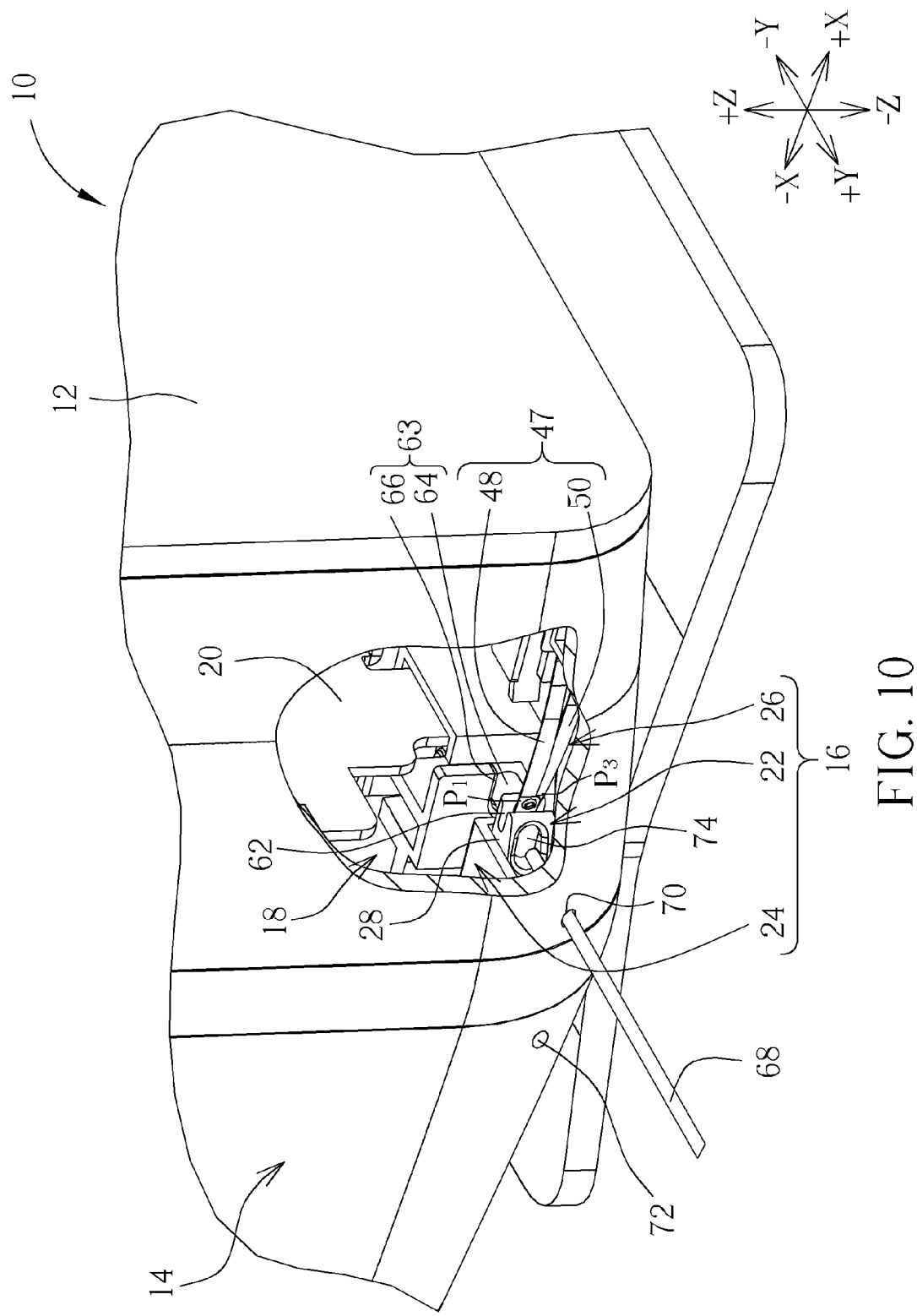
FIG. 10 is a partial internal view of the box-shaped apparatus in FIG. 2 as a first end of the lock rod is pressed to a locking position by an actuating rod.
Figure 11:
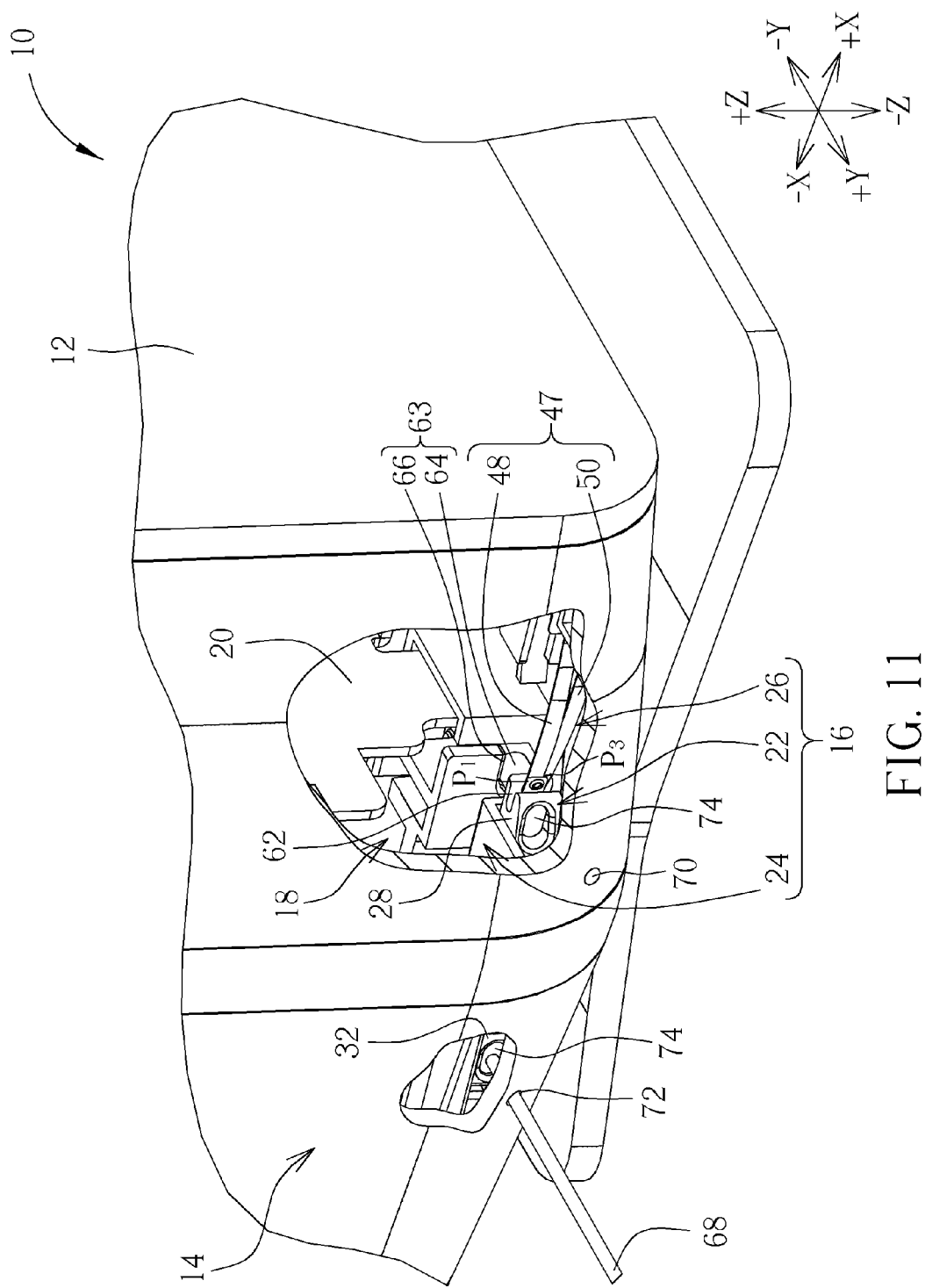
FIG. 11 is a partial internal view of the box-shaped apparatus in FIG. 10 as the actuating rod abuts against the pressing recess of a second end.
Figure 12:
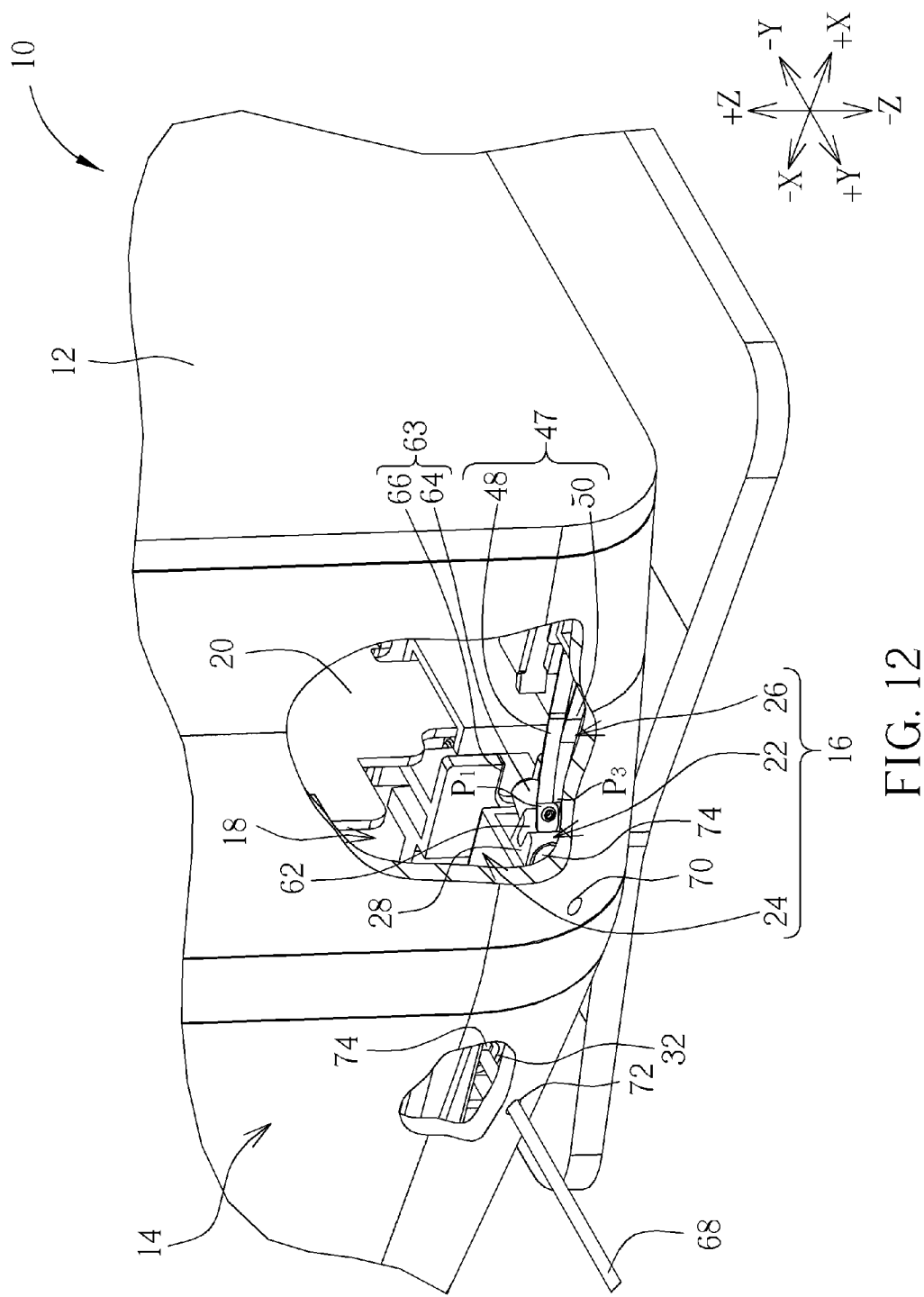
FIG. 12 is a partial internal view of the box-shaped apparatus in FIG. 11 as the second end of the lock rod is pressed by the actuating rod so as to make the first end tilt to a releasing position.
Figure 13:
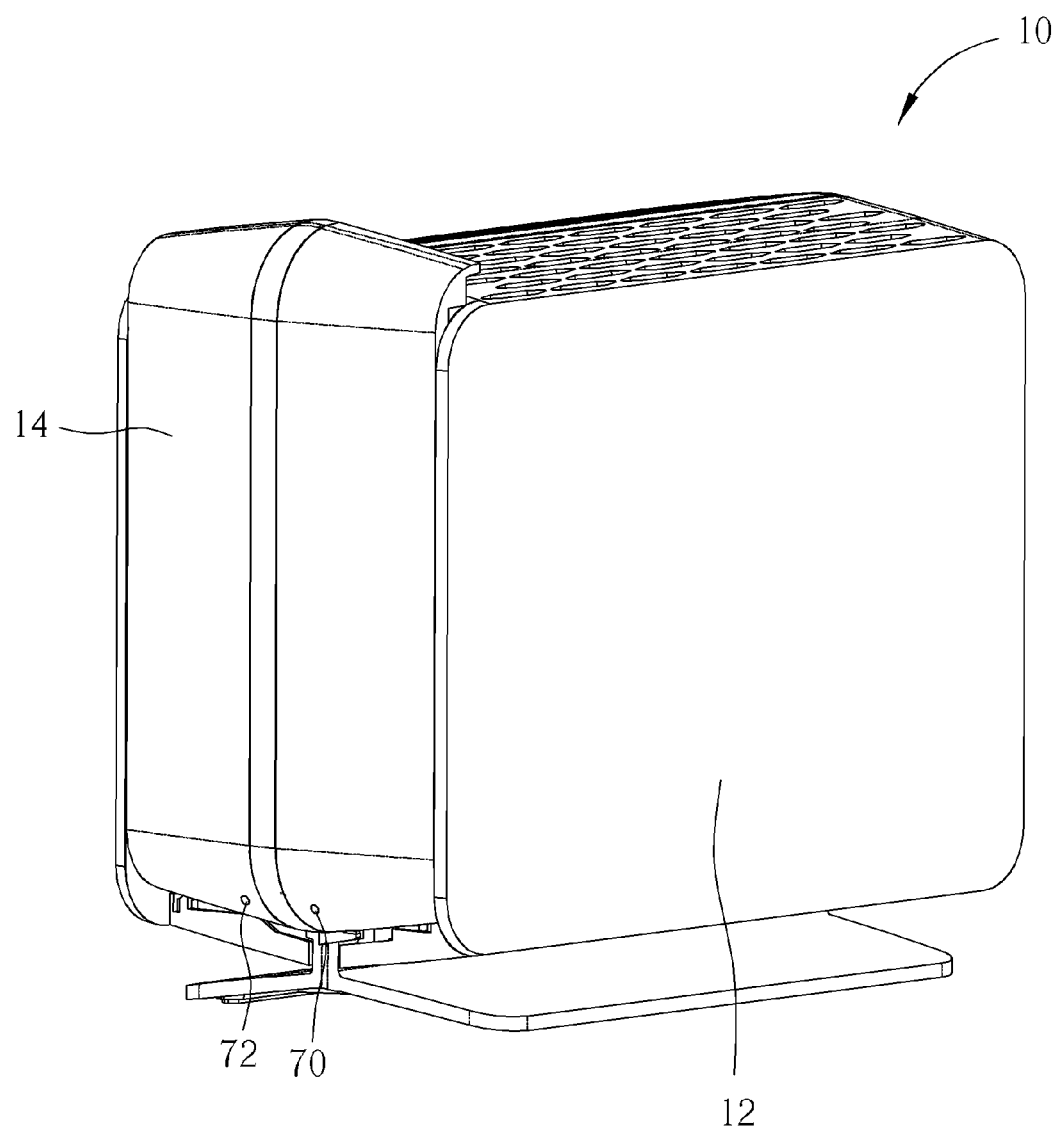
FIG. 13 is a schematic diagram of the cover being pulled out of the casing in FIG. 1.

More detailed description for the locking and releasing operations of the box-shaped apparatus 10 is provided as follows. Please refer to FIG. 2, FIG. 10, FIG. 11, FIG. 12 and FIG. 13. FIG. 10 is a partial internal view of the box-shaped apparatus 10 in FIG. 2 as the first end 28 of the lock rod 22 is pressed to the locking position by the actuating rod 68. FIG. 11 is a partial internal view of the box-shaped apparatus 10 in FIG. 10 as the actuating rod 38 abuts against the pressing recess 74 of the second end 32. FIG. 12 is a partial internal view of the box-shaped apparatus 10 in FIG. 11 as the second end 32 of the lock rod 22 is pressed by the actuating rod 68 so as to make the first end 28 tilt to the releasing position. FIG. 13 is a schematic diagram of the cover 14 being pulled out of the casing 12 in FIG. 1. When a user wants to perform the locking operation of the box-shaped apparatus 10, the user just needs to utilize the actuating rod 68 to pass through the first through hole 70 of the cover 14 for abutting against the pressing recess 74 of the first end 28. Subsequently, the user could push the actuating rod 68 to press the first end 28 to move relative to the casing 12 in a −Y-axis direction from the releasing position as shown in FIG. 2. During this process, since the first arm structure 48 and the second arm structure 50 of the driving arm 26 extend into the interference portion 62 of the first end 28, the first free end $P_1$ of the first arm structure 48 and the second free end $P_3$ of the second arm structure 50 could be pushed by the interference portion 62 with movement of the first end 28, meaning that the arm portion 47 is forced in the −Y-axis direction. At this time, as mentioned above, via the aforesaid design in which the first arm structure 48 and the second arm structure 50 could bend bi-directionally, the first arm structure 48 and the second arm structure 50 could bend toward the −Y-axis direction and then swing to a swing position shown in FIG. 10. Accordingly, the first arm structure 48 and the second arm structure 50 could provide elastic force to push the first end 28 to the locking position where the positioning pillar 64 is engaged with the positioning slot 66 of the casing 12 (as shown in FIG. 10). In such a manner, via engagement of the positioning pillar 64 of the first end 28 of the lock rod 22 with the positioning slot 66 of the casing 12, the cover 14 could be locked on the side of the casing 12 so as to provide an anti-theft function and prevent the box-shaped apparatus 10 from being opened arbitrarily.

On the other hand, if the user wants to pull the cover 14 out of the casing 12 for maintaining the network storage device 20 contained therein or replacing the internal components of the boxed-shaped apparatus 10, the user just needs to utilize the actuating rod 68 to pass through the second through hole 72 of the cover 14 to abut against the pressing recess 74 of the second end 32. Subsequently, the user could push the actuating rod 68 to press the second end 32 to move inward relative to the casing 12 in the −Y-axis direction from a position as shown in FIG. 11, so as to tilt the first end 28. During this process, the first free end $P_1$ of the first arm structure 48 and the second free end $P_3$ of the second arm structure 50 could be pushed by the interference portion 62 with tilt of the first end 28, meaning that the arm portion 47 is forced in a +Y-axis direction. At this time, as mentioned above, via the aforesaid design in which the first arm structure 48 and the second arm structure 50 could bend bi-directionally, the first arm structure 48 and the second arm structure 50 could bend toward the +Y-axis direction and then swing to a swing position as shown in FIG. 11. Accordingly, the first arm structure 48 and the second arm structure 50 could provide elastic force to push the first end 28 from the locking position where the positioning pillar 64 is engaged with the positioning slot 66 of the casing 12 (as shown in FIG. 11) to the releasing position as shown in FIG. 12. Finally, as shown in FIG. 12, since the positioning pillar 64 of the first end 28 of the lock rod 22 is no longer engaged with the positioning slot 66 of the casing 12, the user could pull the cover 14 from the side of the casing 12 until the cover 14 is completely detached from the casing 12 (as shown in FIG. 13). In such a manner, the releasing operation of the box-shaped apparatus 10 could be completed, so that the user could maintain the network storage device 20 contained therein or replace the internal components of the box-shaped apparatus 10 conveniently.

Figure 14:
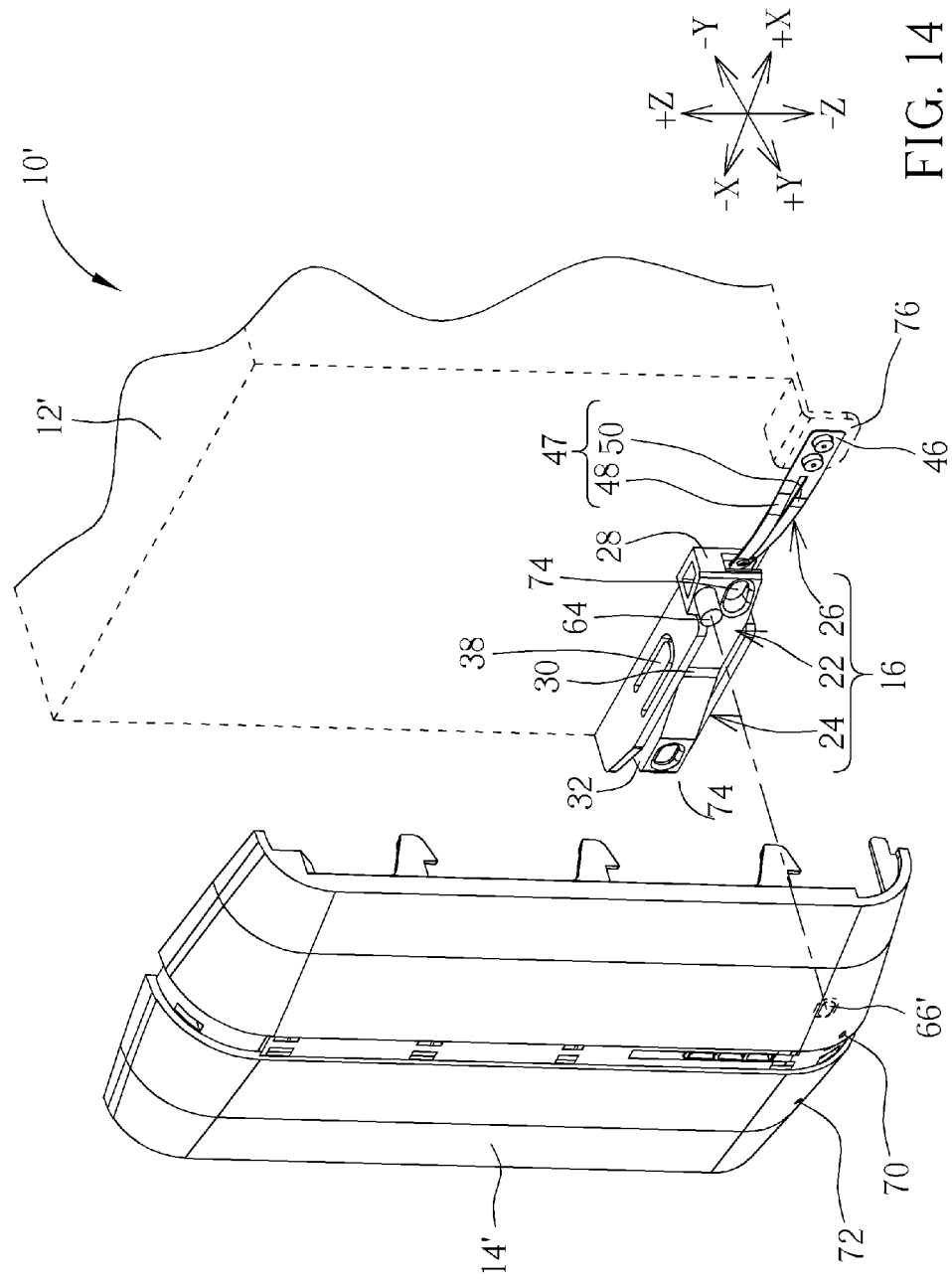
FIG. 14 is a partial exploded diagram of a box-shaped apparatus according to another embodiment of the present invention.

It should be mentioned that the position of the lock mechanism is not limited to the aforesaid embodiment. That is, the lock mechanism could also be disposed on the casing so as to enhance the flexibility of the box-shaped apparatus of the present invention in disposal of the lock mechanism. For example, please refer to FIG. 14, which is a partial exploded diagram of a box-shaped apparatus 10' according to another embodiment of the present invention. The components both mentioned in FIG. 14 and the aforesaid embodiment represent the components with similar functions or structures, and the related description is omitted herein. As shown in FIG. 14, the box-shaped apparatus 10' includes a casing 12', a cover 14' and the lock mechanism 16. For clearly showing the structural relationship of the mechanism 16, the casing 12', and the cover 14', the casing 12' is briefly depicted by dash lines, and the network storage device 20 is omitted. In this embodiment, the casing 12' has a bending arm portion 76. The fixing portion 46 of the driving arm 26 is fixed on the bending arm portion 76 (e.g. by screws) so as to fix the driving arm 26 on the casing 12'. The pivot portion 30 of the lock rod 22 is pivotally connected to the constraining frame 24 of the casing 12' so that the lock rod 22 could be rotatably disposed on the casing 12'. In other words, the lock mechanism 16 is disposed on the casing 12' instead of being disposed on the cover mentioned in the aforesaid embodiment. In addition, a positioning slot 66' is formed on cover 14' corresponding to the first end 28. Accordingly, via engagement of the positioning pillar 64 with the positioning slot 66' of the cover 14', the cover 14' could be fixed on the casing 12'.

The related description for the locking and releasing operations of the box-shaped apparatus 10' could be reasoned according to the aforesaid embodiment. Briefly, when the user wants to perform the locking operation of the box-shaped apparatus 10', the user just needs to utilize the actuating rod 68 to press the second end 32 so that the first arm structure 48 and the second arm structure 50 could bend toward the +Y-axis direction as shown in FIG. 14 to drive the positioning pillar 64 of the first end 28 to engage with the positioning slot 66' of the cover 14' for fixing the cover 14' on the casing 12'. On the other hand, when the user wants to detach the cover 14' from the casing 12', the user just needs to utilize the actuating rod 68 to press the first end 28 so that the first arm structure 48 and the second arm structure 50 could bend toward the −Y-axis direction as shown in FIG. 14 to drive the positioning pillar 64 of the first end 28 to detach from the positioning slot 66' of the cover 14'. Accordingly, the user could pull the cover 14' out of the casing 12'.

Furthermore, the constraining frame mentioned in the aforesaid embodiment could be omitted. That is, in another embodiment of the present invention, the lock rod of the box-shaped apparatus could be pivoted to the cover or the casing directly, so as to simplify the mechanical design of the lock mechanism. In addition, the box-shaped apparatus is not limited to contain a network storage device, meaning that the application of the box-shaped apparatus could vary with the object contained in the containing space or the box-shaped apparatus could just be a container for storage. For example, in another embodiment, the box-shaped apparatus of the present invention could be used for containing a computer host so as to form a computer apparatus.

Compared with the prior art, the present invention utilizes linkage of the bi-directional swinging arm and the pivoting lock rod to lock the cover on the casing. In such a manner, via the aforesaid simple pressing operations, the user could easily lock or release the box-shaped apparatus so as to enhance the convenience of the box-shaped apparatus in detaching the cover from the casing and locking the cover on the casing. Furthermore, via the hidden design in which the lock mechanism is disposed in the cover and the casing, the present invention not only makes the appearance of the box-shaped apparatus more compact, but also effectively solve the prior art problem that the lock disposed outside the box-shaped apparatus could be operated arbitrarily so that the box-shaped apparatus may be opened accidentally. Accordingly, the use security of the box-shaped apparatus could be greatly enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lock mechanism for detachably fixing a cover on a side of a casing, the lock mechanism comprising:
   a lock rod having a first end, a second end and a pivot portion between the first end and the second end, the lock rod being pivoted to one of the cover and the casing through the pivot portion so that the first end and the second end could perform a lever movement relative to the pivot portion, and the first end having an interference portion; and
   a driving arm connected to a side of the lock rod and having a fixing portion and an arm portion connected to the fixing portion, the driving arm being disposed on the one of the cover and the casing through the fixing portion so as to make a free end of the arm portion interfere with the interference portion of the lock rod, and the arm portion swinging to a first swing position when receiving force in a first direction and the arm portion stopping at the first swing position when the force in the first direction is released, and the arm portion swinging to a second swing position when receiving force in a second direction opposite to the first direction and the arm portion stopping at the second swing position when the force in the second direction is released, a curvature of a bending shape of the arm portion at the first swing position being opposite to a curvature of a bending shape of the arm portion at the second swing position;
   wherein the interference portion drives the free end of the arm portion to make the arm portion swing to the first swing position when the first end is pressed and the second swing position when the second end is pressed, so as to make the lock rod move to a locking position for fixing the cover on the casing or move to a releasing position for releasing the cover from the casing.

2. The lock mechanism of claim 1, wherein the arm portion comprises a first arm structure and a second arm structure, the first arm structure has a first free end and a first fixing end, the second arm structure has a second free end and a second fixing end, the first fixing end and the second fixing end are adjacent to each other and connected to the fixing portion, the first free end is connected to the second free end for forming the free end cooperatively to cause bending deformation of the first arm structure and the second arm structure, so that the first arm structure and the second arm structure could only swing to the first swing position or the second swing position.

3. The lock mechanism of claim 1, wherein the interference portion of the first end of the lock rod is a recess, and the free end of the arm portion extends into the recess so as to cause interference with the recess.

4. The lock mechanism of claim 1, wherein a lock device is disposed on one of the first end and the second end of the lock rod for locking the cover on the casing as the lock rod moves to the locking position.

5. The lock mechanism of claim 4, wherein the lock device comprises a positioning pillar disposed on the first end and a positioning slot disposed on the other one of the cover and the casing, the positioning pillar corresponds to the positioning slot, and the positioning pillar is for inserting into the positioning slot so as to fix the cover on the side of the casing as the lock rod moves to the locking position.

6. The lock mechanism of claim 1 further comprising:
   a constraining frame disposed on the one of the cover and the casing, and a concave portion being formed on the constraining frame for containing the lock rod to pivot therein and for constraining the movement range of the lock rod when the first end or the second end is pressed.

7. The lock mechanism of claim 6, wherein at least one elastic arm is formed on an inner wall of the concave portion, a pivot shaft is formed on an end of the at least one elastic arm, a pivot hole is formed on the pivot portion corresponding to the pivot shaft, the at least one elastic arm is for providing elastic force to drive the pivot shaft to insert into the pivot hole as the lock rod is contained in the concave portion so as to make the pivot portion pivotally connected to the constraining frame.

8. The lock mechanism of claim 7, wherein a chamfer structure is respectively formed on the pivot shaft and an assembling path of the lock rod corresponding to the pivot shaft for guiding the pivot shaft to insert into the pivot hole.

9. The lock mechanism of claim 1, wherein the cover has a fixing base, the fixing base has a fixing protrusion and a fixing hole, an engaging slot and an elastic sheet are formed on the fixing portion of the driving arm, and the elastic sheet pops up from the fixing hole to engage with the fixing hole as the engaging slot is engaged with the fixing protrusion so as to make the driving arm fix on the cover.

10. The lock mechanism of claim 1, wherein the casing has a bending arm portion, the fixing portion of the driving arm is fixed on the bending arm portion so as to fix the driving arm on the casing, and the lock rod is pivoted to the casing.

11. The lock mechanism of claim 1, wherein a pressing recess is formed on the first end and the second end respectively.

12. The lock mechanism of claim 1, wherein the lock rod is a V-shaped lever structure.

13. A box-shaped apparatus comprising:
   a casing;
   a cover engaged with the casing to form a containing space; and
   a lock mechanism for detachably fixing the cover on a side of the casing, the lock mechanism comprising:
      a lock rod having a first end, a second end and a pivot portion between the first end and the second end, the lock rod being pivoted to one of the cover and the casing through the pivot portion so that the first end and the second end could perform a lever movement relative to the pivot portion, and the first end having an interference portion; and
      a driving arm connected to a side of the lock rod and having a fixing portion and an arm portion connected to the fixing portion, the driving arm being disposed on the one of the cover and the casing through the fixing portion so as to make a free end of the arm portion interfere with the interference portion of the lock rod, and the arm portion swinging to a first swing position when receiving force in a first direction and the arm portion stopping at the first swing position when the force in the first direction is released, and the arm portion swinging to a second swing position when receiving force in a second direction opposite to the first direction and the arm portion stopping at the second swing position when the force in the second direction is released, a curvature of a bending shape of the arm portion at the first swing position being opposite to a curvature of a bending shape of the arm portion at the second swing position;
      wherein the interference portion drives the free end of the arm portion to make the arm portion swing to the first swing position when the first end is pressed and the second swing position when the second end is pressed, so as to make the lock rod move to a locking position for fixing the cover on the casing or move to a releasing position for releasing the cover from the casing.

14. The box-shaped apparatus of claim 13, wherein the arm portion comprises a first arm structure and a second arm structure, the first arm structure has a first free end and a first fixing end, the second arm structure has a second free end and a second fixing end, the first fixing end and the second fixing end are adjacent to each other and connected to the fixing portion, the first free end is connected to the second free end for forming the free end cooperatively to cause bending deformation of the first arm structure and the second arm structure, so that the first arm structure and the second arm structure could only swing to the first swing position or the second swing position.

15. The box-shaped apparatus of claim 13, wherein the interference portion of the first end of the lock rod is a recess, and the free end of the arm portion extends into the recess so as to cause interference with the recess.

16. The box-shaped apparatus of claim 13, wherein a lock device is disposed on one of the first end and the second end of the lock rod for locking the cover on the casing as the lock rod moves to the locking position.

17. The box-shaped apparatus of claim 16, wherein the lock device comprises a positioning pillar disposed on the first end and a positioning slot disposed on the other one of the cover and the casing, the positioning pillar corresponds to the positioning slot, and the positioning pillar is for inserting into the positioning slot so as to fix the cover on the side of the casing as the lock rod moves to the locking position.

18. The box-shaped apparatus of claim 17 further comprising:
   a constraining frame disposed on the one of the cover and the casing, and a concave portion being formed on the constraining frame for containing the lock rod to pivot therein and for constraining the movement range of the lock rod when the first end or the second end is pressed.

19. The box-shaped apparatus of claim 18, wherein at least one elastic arm is formed on an inner wall of the concave portion, a pivot shaft is formed on an end of the at least one elastic arm, a pivot hole is formed on the pivot portion corresponding to the pivot shaft, the at least one elastic arm is for providing elastic force to drive the pivot shaft to insert into the pivot hole as the lock rod is contained in the concave portion so as to make the pivot portion pivotally connected to the constraining frame.

20. The box-shaped apparatus of claim 19, wherein a chamfer structure is respectively formed on the pivot shaft and an assembling path of the lock rod corresponding to the pivot shaft for guiding the pivot shaft to insert into the pivot hole.

21. The box-shaped apparatus of claim 13, wherein the cover has a fixing base, the fixing base has a fixing protrusion and a fixing hole, an engaging slot and an elastic sheet are formed on the fixing portion of the driving arm, and the elastic sheet pops up from the fixing hole to engage with the fixing hole as the engaging slot is engaged with the fixing protrusion so as to make the driving arm fix on the cover.

22. The box-shaped apparatus of claim 13, wherein the casing has a bending arm portion, the fixing portion of the driving arm is fixed on the bending arm portion so as to fix the driving arm on the casing, and the lock rod is pivoted to the casing.

23. The box-shaped apparatus of claim 13, wherein a pressing recess is formed on the first end and the second end respectively.

24. The box-shaped apparatus of claim 13, wherein the lock rod is a V-shaped lever structure.

25. The box-shaped apparatus of claim 13, wherein a first through hole is disposed on the cover corresponding to the first end, a second through hole is disposed on the cover corresponding to the second end, and the box-shaped apparatus further comprises an actuating rod for passing through the first through hole to press the first end or passing through the second through hole to press the second end.

26. The box-shaped apparatus of claim 13 further comprising:
   a network storage device disposed in the containing space.

* * * * *